US011209474B2

(12) United States Patent
Alibert et al.

(10) Patent No.: US 11,209,474 B2
(45) Date of Patent: Dec. 28, 2021

(54) METHOD FOR LOCATING PHASE FAULTS IN A MICROGRID

(71) Applicant: Schneider Electric Industries SAS, Rueil Malmaison (FR)

(72) Inventors: Philippe Alibert, Lans-en-Vercors (FR); Vanya Ignatova, Saint Martin d'Hères (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 85 days.

(21) Appl. No.: 16/418,062

(22) Filed: May 21, 2019

(65) Prior Publication Data

US 2020/0041561 A1 Feb. 6, 2020

(30) Foreign Application Priority Data

Jul. 31, 2018 (EP) .................................. 18306031

(51) Int. Cl.
| | |
|---|---|
| *G01R 31/08* | (2020.01) |
| *H02H 1/00* | (2006.01) |
| *H02H 7/22* | (2006.01) |
| *H02H 7/26* | (2006.01) |

(52) U.S. Cl.
CPC ......... *G01R 31/088* (2013.01); *G01R 31/086* (2013.01); *H02H 1/0007* (2013.01); *H02H 7/22* (2013.01); *H02H 7/26* (2013.01)

(58) Field of Classification Search
CPC .......... H02H 7/26; H02H 7/261; H02H 7/263; H02H 7/267; H02H 7/266; H02H 1/007; H02H 3/28; H02H 7/22; H02J 3/0012; H02J 3/381; H02J 13/00006; H02J 13/00; H02J 13/00034; H02J 13/0004
See application file for complete search history.

(56) References Cited

U.S. PATENT DOCUMENTS

| | | | | |
|---|---|---|---|---|
| 9,923,371 | B1* | 3/2018 | Emert | H02J 3/06 |
| 10,269,509 | B1* | 4/2019 | Habib | H02J 3/38 |
| 2003/0216876 | A1* | 11/2003 | Premerlani | H02H 7/261 |
| | | | | 702/58 |

(Continued)

FOREIGN PATENT DOCUMENTS

EP 2194656 6/2010

OTHER PUBLICATIONS

Extended European Search Report for European Patent Application No. 18306031.8 dated Jan. 29, 2019, 10 pages.

(Continued)

*Primary Examiner* — Gustavo A Rosario-Benitez
(74) *Attorney, Agent, or Firm* — Locke Lord LLP

(57) ABSTRACT

A method for locating and clearing phase faults in a microgrid in off-mode. The method includes determining a surveillance area of a microgrid having at least two busbars to monitor; determining all source feeders and load feeders of the surveillance area; acquiring measurement data comprising current magnitude for all source feeders and load feeders; and monitoring the at least two busbars in the surveillance area for a voltage dip in one of phase-to-phase or phase-to-neutral voltages. The method further includes, on detecting a voltage dip on the monitored busbars, determining a defect phase having a minimum phase-to-neutral voltage; and performing current analysis for the defect phase.

13 Claims, 4 Drawing Sheets

(56) References Cited

U.S. PATENT DOCUMENTS

| | | | |
|---|---|---|---|
| 2007/0238362 A1* | 10/2007 | Newman | H02H 7/268 439/620.24 |
| 2008/0158750 A1 | 7/2008 | Premerlani et al. | |
| 2010/0002348 A1* | 1/2010 | Donolo | H02H 7/261 361/64 |
| 2011/0282507 A1* | 11/2011 | Oudalov | H02H 3/006 700/292 |
| 2013/0262922 A1* | 10/2013 | Song | H02J 13/0079 714/14 |
| 2014/0063669 A1* | 3/2014 | Lundqvist | H02H 3/30 361/79 |
| 2014/0098450 A1* | 4/2014 | Ecu | H02H 3/40 361/83 |
| 2015/0261240 A1 | 9/2015 | Mokhtari et al. | |
| 2019/0097410 A1* | 3/2019 | Valtari | G05F 1/66 |
| 2019/0319450 A1* | 10/2019 | Jung | H02H 7/22 |
| 2019/0331726 A1* | 10/2019 | Ha | G01R 31/083 |
| 2019/0379209 A1* | 12/2019 | Mohsenian-Rad | G01R 19/2513 |

OTHER PUBLICATIONS

Gopalan, S. et al., "An Improved Protection Strategy for Microgrids", 2013 4th IEEE PES Innovative Smart Grid Technologies Europe (ISGT Europe), Oct. 6-9, 2013, Copenhagen, 5 pages.

Yin, X. et al., "Strategy Research of Low Voltage Photovoltaic Microgrid Protection", 2014 IEEE PES Asia-Pacific Power and Energy Engineering Conference, Dec. 7, 2014, 6 pages.

Extended European Search Report for European Patent Application No. 18306032.6 dated Sep. 13, 2018, 7 pages.

U.S. Appl. No. 16/418,092, filed May 21, 2019, Philippe Alibert.

* cited by examiner

METHOD FOR LOCATING PHASE FAULTS IN A MICROGRID

The present invention relates to a method for locating electrical faults in a microgrid, and in particular to a microgrid including distributed renewable and non-renewable energy sources.

BACKGROUND

A microgrid is basically a local electrical grid intended to generate and distribute electrical power in regions that are isolated and far from large electrical energy generation stations, such as, for example, islands, mountainous regions or desert areas. The microgrid principle is also applicable when it is desired for a building, neighborhood, campus or other entity connected to a wide distribution grid to manage the generation of its energy differently and e.g. increase its capacity for resilience. Thus, in general, a microgrid is an electrical installation integrating renewable and non-renewable energy sources and/or storage that is able to operate in both on-grid mode, that is connected to a utility grid, and in off-grid mode.

Microgrids may be made up of various kind of energy resources that are spatially distributed and disconnected from a main i.e. utility grid, also referred to as distributed energy resources DER. Such microgrids are set up as autonomous islands for energy supply. These distributed resources may include renewable energy resources, such as photovoltaic cells, solar panels and wind turbines. They further may include engine-generator energy resources, such as fuel consuming engines or turbines. And they may comprise energy storage facilities for locally storing energy, which may include chemical type storage such as batteries or mechanical type storage such as flywheels. As common for electrical installations, the various local parts are referred to as feeder bays or feeders in short, which are connected to busbars having a single voltage in order to distribute the energy.

An illustrative example of a microgrid is shown schematically in in FIG. 1. The microgrid may functionally be split into a resource plane, a network plane and a control plane. The resource plane includes the distributed energy resources of renewable, generator and storage resources. In turn, each of the different types of energy resources may be collectively organized in distinct plants, such as a renewable plant, a generator set plant and a storage plant. The network plane includes the distribution network and loads to which energy is supplied. The control plane includes the local controllers for each plant of energy resource types and an overall microgrid central controller for centrally controlling the coordination between the different energy plants.

As renewable energy sources operate as DC sources, these are equipped with inverters in order to provide an AC signal that may be coupled to the grid. The AC signals provided by the inverters need to match the grid in both phase and magnitude. In order to ensure proper electrical coupling to the grid, the connections to the grid are supervised/monitored via Protection Relays operating electrical switch gear equipment, such as circuit breakers, enabling to disconnect one or more of the energy resources from the grid. This would for example be required in case of short circuit currents occurring in either the microgrid grid or the grid.

The inverters of these renewable resources are characterized by low short circuit capacity. In case of electrical faults, inverter-based sources limit the short-circuit currents to values not much higher than the nominal current to protect the inverter itself.

When installations with photovoltaic and storage resources operate in on-grid mode, the short circuit currents delivered from the grid in case of electrical fault are high, and traditional overcurrent protection is used. When these installations operate in off-grid mode, the short circuit currents are low and cannot be detected by overcurrent protection devices—at least for some feeders. Residual Current Devices can be used to detect phase to ground faults. However, phase faults, including both phase to phase faults, phase to neutral faults and three phase faults, remain undetected, presenting a risk of fire within few seconds. Accordingly, additional methods for detecting, locating and protecting microgrids are required.

In particular, methods are required to detect and isolate phase electrical faults for installations powered by distributed renewable and storage resources, and while able to operate disconnected from a main grid.

SUMMARY OF INVENTION

It is an object of the invention to provide a method that allows to detect a phase fault in a microgrid in off-grid mode.

According to the invention, this object is achieved by a method that includes determining a surveillance area of a microgrid having at least two busbars to monitor; determining all source feeders and load feeders of the surveillance area; acquiring measurement data comprising current magnitude for all source feeders and load feeders; and monitoring the at least two busbars in the surveillance area for a voltage dip in one of phase-to-phase or phase-to-neutral voltages. The method further includes, on detecting a voltage dip on one of the monitored busbars, determining a defect phase having a minimum phase-to-neutral voltage; and performing current analysis for the defect phase.

In case of an electrical fault, all energy sources will deliver a maximal current, the majority of which contributing to feed the electrical fault. Each fault location is characterized by a unique "signature"—defined by a unique current flow and current magnitude at each point of the installation, which may be used to identify the fault location.

The proposed method uses a centralized software-based system communicating with the protection and measurement units at every feeder and all voltage relays installed at source busbars. In on-grid mode, protection may be assured by overcurrent protection devices as known. In off-grid mode, however, the presence of fault is identified by the software system as follows:

Identifying presence of a fault through detection of a voltage drop at at least one source busbar. Determining the fault location through analysis of the current magnitudes of all feeders of each busbar. Once the fault is localized, a tripping order may be sent to the nearest switchgear equipment, such as circuit breaker, to disconnect the faulty part from sources feeding the located fault.

Particular embodiments of the invention are set forth in the dependent claims.

Further objects, aspects, effects and details of the invention are described in the following detailed description of a number of exemplary embodiments, with reference to the drawings.

BRIEF DESCRIPTION OF DRAWINGS

By way of example only, the embodiments of the present disclosure will be described with reference to the accompanying drawing, wherein.

DETAILED DESCRIPTION

Figure 2:
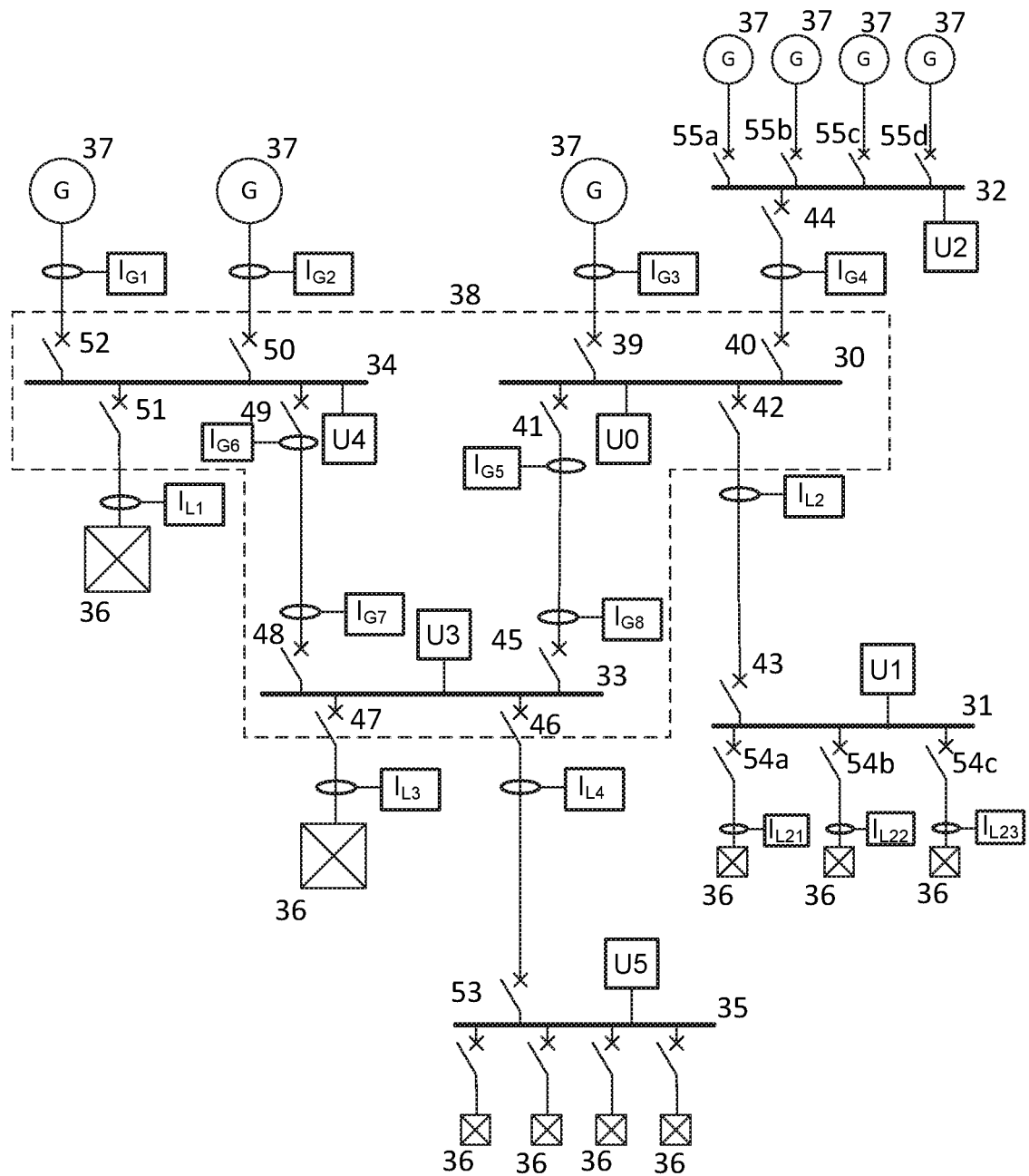
FIG. 2 shows an example of a single line diagram of a microgrid.

Referring to FIG. 2, a single line diagram is shown representing an example of a microgrid. The microgrid has six busbars 30-35 connecting various loads 36 and different energy resources 37. The energy resources 37 may be non-renewable, such as fueled generators, or renewable, such as photovoltaic cells. Each connection may be referred to as a feeder bay or feeder in short. The microgrid further has voltage measurement devices U0-U5 and current measurement devices indicated by $I_{G1}$-$I_{G4}$ for generator currents and $I_{L1}$-$I_{L4}$ and $I_{L21}$-$I_{L23}$ for load currents. Each current measurement device is associated with one feeder, being either incoming or outgoing. Each feeder may be connected and disconnected by a corresponding circuit breaker 39-52 from the respective busbar. For example, busbar 30 has one circuit breaker 39 controlling connection to one energy resource 37, one circuit breaker 40 controlling connection to busbar 32 connected to further energy resources 37, one circuit breaker 42 controlling connection to busbar 31 connected to loads 36, and one circuit breaker 41 controlling connection to busbar 33 and further parts of the microgrid. Additional circuit breakers 43 and 44 may be used to further control connection of busbars 31 and 32 respectively. The feeders of additional busbars 31, 32 are also provided with further circuit breakers 54a-c, and 55a-d.

The microgrid is a three phase system, so there are three phase-to-phase voltages Uab, Ubc and Uca and three phase-to-neutral voltages Uan, Ubn and Ucn. The voltage measurement devices U0-U5 measure each of these voltages for the respective busbars 30-35. Similarly, the current measurement devices measure the current in each phase for the respective feeders. Furthermore, each circuit breaker 39-55 may have a control element associated with it for controlling connection. In this example, the circuit breakers are remotely controlled individually via a single central control/protection element (not shown). In another example, for Low Voltage, the control elements may be trip units. In another example, for High or Medium Voltage, the control elements may be a protection relays.

Figure 1:
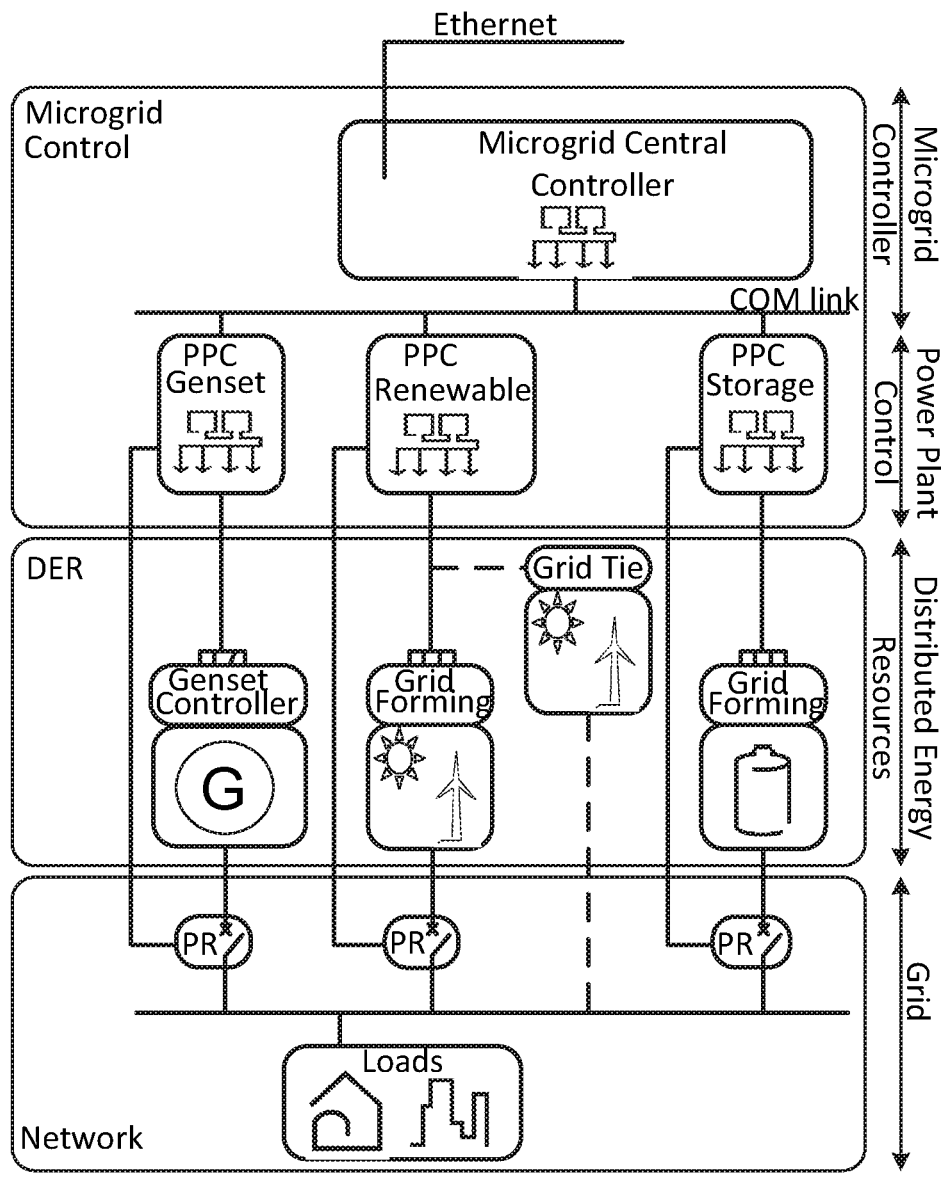
FIG. 1 illustrates schematically an example of a microgrid.

Indicated by a dashed line is a surveillance area 38 for which the voltage of the busbars and the current measurements of all connected feeders are available. The surveillance area 38 includes al busbars that are connected to at least two sources. And current measurements for all incoming source feeders and outgoing load feeders should be available. In addition, the position or state, open or closed, of all relevant circuit breakers 39-52 within the surveillance area should be known. These elements determine a grid topology of the microgrid. The general grid topology may be known in advance, e.g. from the design phase or engineering process, and may usually be available from a file stored within a control system of the microgrid. For example, within the IEC 61850 framework, the topology may be e.g. obtained from the substation section of a .SCD or .SSD file which comply with standard configuration file formats. The storage and access may be arranged by a central controller, e.g. the microgrid central controller of FIG. 1. The position of all circuit breakers would also be available from the same central controller.

From the grid topology it will also be known which feeders are incoming i.e. connected to sources and which are outgoing i.e. connected to loads and accordingly in which direction currents are designed to flow. With the type of feeder, load or source, known for all feeders, and indicated requirements for a surveillance area 38, a method for locating phase faults is possible by performing analysis of the one or more busbars based on current magnitudes only. The method may only be applied to a part of the microgrid, referred to as surveillance area, that includes all busbars connected to at least two sources, for which the voltages of the busbars are available, for which current measurements of all feeders of the busbars are available and for which the position or states of all circuit breakers connected to these busbars are available.

Figure 3:
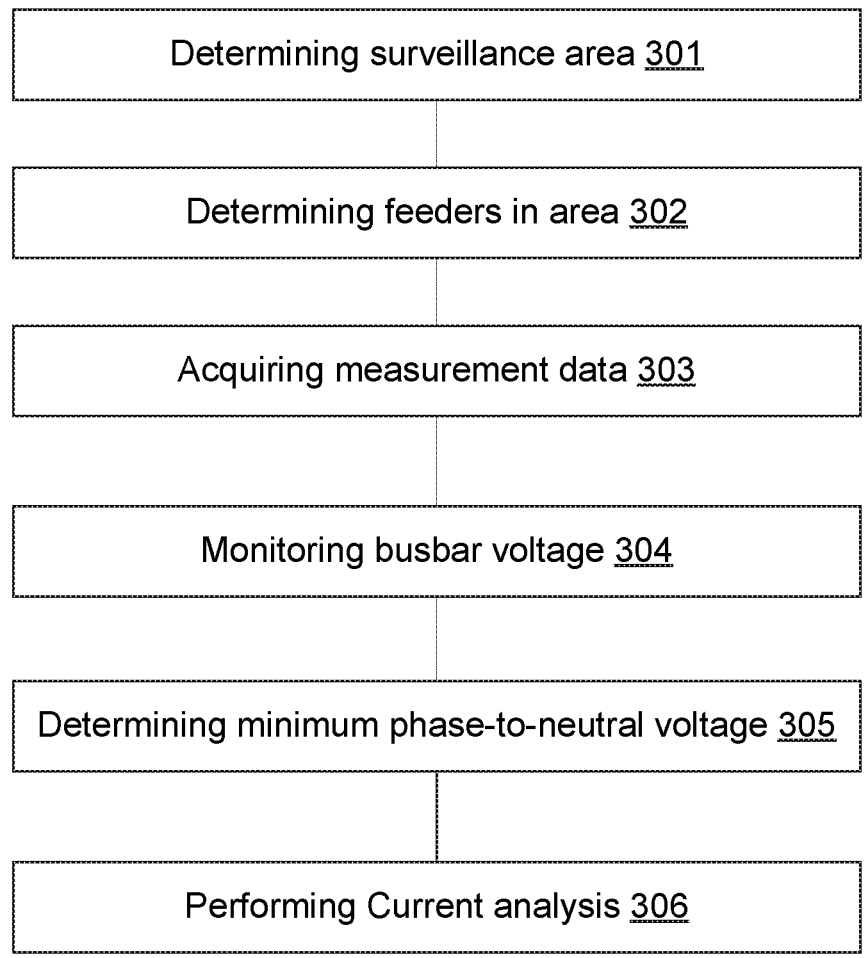
FIG. 3 shows an example of a method in accordance with the invention.

Referring to FIG. 3, an example of a method for locating phase faults in a microgrid in off-grid mode is shown. The method includes determining 301 a surveillance area 38 of the microgrid having at least two busbar connected to at least two sources 37. As mentioned, the surveillance area depends on the position of circuit breakers and includes all busbars connected to at least two energy sources. The method further includes determining all incoming and outgoing feeders 302 of the surveillance area. Then acquiring current measurement data 303, the measurement data including current magnitude for all feeders. The measurement data may be acquired continuously, or only when triggered on detecting a phase fault. The measurement data may include the current magnitude for each phase of all feeders or only for the phase of all feeders for which a voltage dip was detected.

The method further includes monitoring the one or more busbars 304 in the surveillance area 38 for a voltage dip for all six phase voltages. These include three phase-to-phase voltages $U_{AB}$, $U_{BC}$, $U_{CA}$ and three phase-to-neutral voltages $V_{AN}$, $V_{BN}$, $V_{CN}$. When a voltage dip is detected on one of the at least two monitored busbars, a phase having a minimum phase-to-neutral voltage 305 value is determined. For this faulty phase, the phase having the minimum phase-to-neutral voltage, current analysis 306 is performed.

Performing current analysis 306 includes performing an area current analysis for at least the surveillance area 38 and, depending on the outcome of the area current analysis, further performing busbar current analysis for each individual busbar within the surveillance area 38. The busbar current analysis of each individual busbar is preferably performed simultaneously, in order to reduce the amount of time required for locating the phase fault.

The part of the microgrid being monitored, the surveillance area 38 in FIG. 2, may be regarded as node to which Kirchhoff's current laws apply. Hence, all incoming currents should be equal to all outgoing currents or, equated differently, the sum of all incoming and outgoing current should be zero.

$$\Sigma I_{Gx} - \Sigma I_{Lx} = 0 \qquad \text{(formula 1),}$$

wherein $I_{Gx}$ refers to measured source currents, and wherein $I_{Lx}$ refers to measured load currents.

Accordingly, performing area current analysis may include applying Kirchhoff's current law to determine if a detected phase fault is located outside and downstream of the surveillance area 38. Applying Kirchhoff's law includes assigning opposite signs to incoming i.e. source and outgoing i.e. load currents and summing all current magnitudes to locate a phase fault if the sum is not equal to zero. If Kirchhoff's law remains valid, i.e. the sum is zero, or at least nearly zero, so the outgoing currents match the incoming currents, a first circuit breaker 51, 47, 46, or 42 corresponding to one of the outgoing feeders having a maximum current value is tripped. The tripping of the first circuit breaker may be performed after a time delay to ensure a time discrimination with one or more downstream circuit breakers which are not monitored and not controlled.

In order to take in account potential measurement errors and phase shift between currents, prior to tripping the first circuit breaker 51, 47, 46, or 42 a further comparison may be performed:

$$ABS(\Sigma I_{Gx} \times \Sigma I_{Lx}) \leq 0.05 \times \Sigma I_{Gx} \quad \text{(formula 2)}$$

If this formula 2 holds true, also formula 1 holds true, and the phase fault will be outside the monitored area on one of the outgoing feeders.

The tripping of the first circuit breaker 42 may be preceded or even precluded by tripping one of the circuit breakers 43, 54a-c downstream of the circuit breaker 42. This may be done when current measurements thereof are available, as it may be determined if a single feeder located further downstream may be the sole cause of the phase fault. In the example of FIG. 2 this is the case for current measurement devices $I_{L21}$, $I_{L22}$, and $I_{L23}$ on the feeders of downstream busbar 31. And it is checked whether any of these measured currents $I_{L21}$-$I_{L23}$ matches the outgoing feeder current $I_{L2}$. Moreover, if one of the circuit breakers 43, 54a-c downstream is tripped, circuit breaker 51, 47, 46, 42 may not be required to trip and hence, be prevented from tripping.

Accordingly, if Kirchhoff's law is valid, and if current measurements are available for feeders on a level downstream, the outgoing current $I_{L2}$ of busbar 30, which is the incoming current of busbar 31, may be compared to each of the outgoing currents $I_{L21}$, $I_{L22}$, and $I_{L23}$ of busbar 31. And if one of these phase currents is equal to the incoming current $I_{L2}$, preferably within a 10% margin, prior to or even instead of tripping the main circuit breaker 42, one of the circuit breakers 54a-c of the corresponding downstream level outgoing feeder may be tripped with a pre-determined time delay. A 10% margin is preferably applied to take in account measurement accuracy, errors and potential phase shifts between currents. If the margin exceeds 10%, the phase fault is located between the busbar levels, and the circuit breakers 42 and/or 43 are tripped.

The above method for analysis could also be applied during operation when no phase fault is detected. The conditions mentioned in formulae 1 and 2 should then also be valid. If not, and no voltage disturbance is detected, it indicates that the assessed grid topology of the microgrid is not correct and that the protection method is not ready for proper operation.

In the event that Kirchhoff's law is not valid, it means that the fault is within the area under surveillance 38 or in a source feeder upstream thereof. So in the example of FIG. 2 either on one of the busbars 30, 33 or 34 or upstream thereof, for example upstream of busbar 30 meaning on one of the incoming feeders controlled respectively by circuit breakers 39 and 40. In order to locate the fault in this case, an individual busbar analysis for each of the busbars 30, 33, 34 is performed. The individual busbar analysis will provide the direction of the short-circuit across the busbars 30, 33, and 34 through the surveillance area and allow to determine the fault location.

In a correctly operating microgrid for each busbar in the surveillance area again Kirchhoff's law should be valid. However, a set of system equations for the incoming and outgoing currents may still be composed. With the assumption that one of the incoming feeders actually drains current in the opposite outgoing direction, for each possible faulty source feeder a corresponding current equation can be set up:

For example, for busbar 30 the following set of equations would apply:

$$I_{G3}+I_{G4}=I_{G5}+I_{L2} \quad \text{(eq. 1)}$$

$$I_{G4}+I_{G5}=I_{G3}+I_{L2} \quad \text{(eq. 2)}$$

$$I_{G3}+I_{G5}=I_{G4}+I_{L2} \quad \text{(eq. 3)}$$

For equation 1, the current $I_{G5}$ of the source feeder is presumed outgoing, while for equation 2, the current $I_{G3}$ of the source feeder is presumed outgoing. And for equation 3, the current $I_{G4}$ of the source feeder is presumed outgoing. In other words, due to the fault, the faulty phase of the feeder acts as a load feeder, despite it being connected to a source and hence intended to be an incomer source feeder. The equations may be re-arranged differently:

$$I_{G3}+I_{G4}-I_{G5}-I_{L2}=0 \quad \text{(eq. 1)}$$

$$-I_{G3}+I_{G4}+I_{G5}-I_{L2}=0 \quad \text{(eq. 2)}$$

$$I_{G3}-I_{G4}+I_{G5}-I_{L2}=0 \quad \text{(eq. 3)}$$

The equation having the minimum summed value does indicate which source feeder, $I_{G3}$, $I_{G4}$ or $I_{G5}$ is the possible source of the phase fault. Stated differently:

$$\text{Sum}_{G5}=I_{G3}+I_{G4}-I_{G5}-I_{L2} \quad \text{(eq. 4)}$$

$$-\text{Sum}_{G3}=I_{G3}+I_{G4}+I_{G5}-I_{L2} \quad \text{(eq. 5)}$$

$$\text{Sum}_{G4}=I_{G3}-I_{G4}+I_{G5}-I_{L2} \quad \text{(eq. 6)}$$

Hence, the sum of the currents having the lowest or minimum value indicates the direction of the possible fault current. To further ease assessing the minimum value, the absolute value of each sum may be determined.

If the minimum value of equations eq. 4, eq. 5 and eq. 6 would direct to the source feeder measured by $I_{G3}$, that source feeder would be the origin of the fault as only one source 37 is connected thereto. Accordingly, corresponding circuit breaker 39 could be tripped, under consideration of a certain time delay.

If the minimum value of equations eq. 4, eq. 5 and eq. 6 would direct to the source feeder measured by $I_{G4}$, the origin of the fault may be any of the sources 37 connected to busbar 32 via the respective circuit breakers 55a-d. Accordingly, one of the corresponding circuit breakers 40 or 44 could be tripped, under consideration of a certain time delay, in accordance with the time discrimination rules between circuit breakers 40 or 44 and circuit breaker 55.

As the above assessment of minimum values is performed for each busbar 30, 33 and 34, final determination of the fault location becomes possible; the location being either on an incoming source feeder, including feeders between two busbars, or on one of the busbars.

With the minimum summed values for each busbar available, the short-circuit or fault current may be traced through the surveillance area. Meaning that the direction indicated by the minimum summed value per busbar can be traced to an incoming feeder. In the example of FIG. 2, if the minimum value for busbar 30 would direct to $I_{G5}$, and consecutively the minimum summed value for busbar 33 would direct to $I_{G}S$, the fault could be traced to one of the incoming feeders associated with $I_{G1}$ or $I_{G2}$ as indicated by the minimum summed value for busbar 34. And then either circuit breaker 50 or 52 could be tripped. If the voltage is not recovered, the fault is on the busbar 34 itself, and all the circuit breakers of the incoming feeders are tripped.

On the other hand, if the minimum summed values for two connected busbars collide, the fault is on an internal feeder and circuit breakers on both ends of that feeder could be tripped. In FIG. 2, for example this would be if the minimum summed value for busbar 30 would direct to the feeder associated with $I_{G5}$ and for busbar 33 would direct to the feeder associated with $I_{G8}$. Hence, in that case both circuit breakers 41 and 45 would be tripped.

In the event that the phase fault is not cleared after tripping of the appropriate circuit breakers, and thus a voltage dip or disturbance is still present, the phase fault could be located on one of the busbars itself. In that case, all other incoming feeders of the busbar for which already the first circuit breaker was tripped are also tripped. Thus, if the minimum summed value resulted in tripping circuit breaker 52 in FIG. 2, now further circuit breakers 49 and 50 are tripped to clear the phase fault. In this case, though the minimum summed value provided an indication of the fault location, the fault was not cleared; indicating that the fault is located on the busbar itself.

Figure 4:
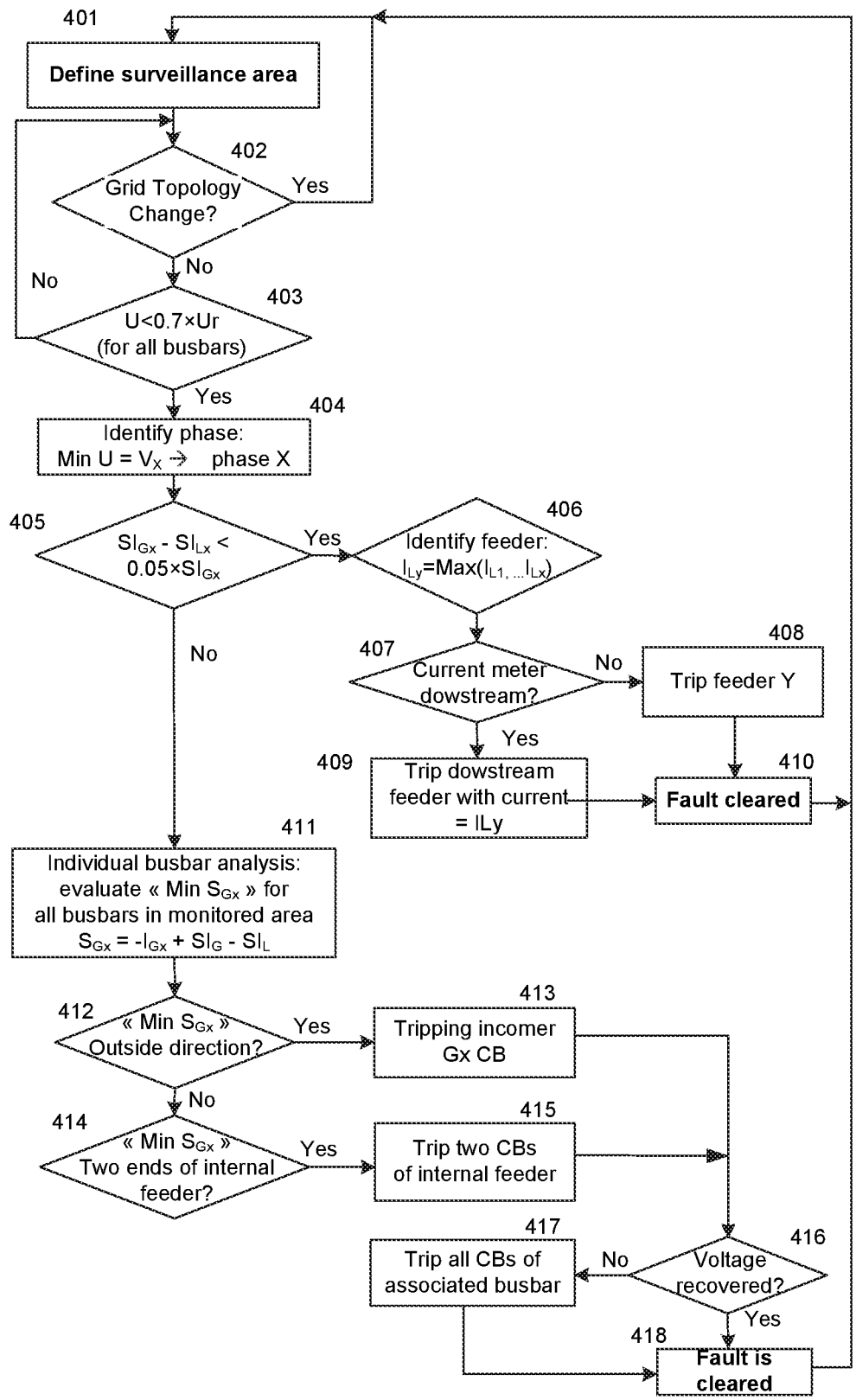
FIG. 4 shows an example of a flow chart for an example of a method based on current magnitude measurements in accordance with the invention.

The method as disclosed may be performed by a central control element having one or more processing units as part of the control plane of the microgrid. Shown in FIG. 4 is an example of a flowchart for implementing an example of the method. The control element executing the method will be connected with all the measurement devices and trip units for communication. The grid topology will be available from the control element.

The flow chart starts by defining 401 the surveillance area of the microgrid, as described above, and include all busbars connected to two or more sources. Defining the surveillance area further includes identifying all source feeders and load feeders present in the surveillance area. During execution, the grid topology 402 will be checked for changes in busbars, feeders, loads and sources; and if required will re-define the surveillance area. Furthermore, while in operation, the control element will continuously acquire measurement data which includes current magnitude for all source feeders and load feeders and voltage levels of the busbars.

The busbars in the surveillance area are monitored 403 for a voltage dip in one of phase-to-phase or phase-to-neutral voltages, as acquired by the control element. On detecting a voltage dip, it is determined which of three possible phases is a defect phase by identifying the phase 404 having the minimum phase-to-neutral voltage. To allow for some measurement error and phase shift between currents when checking compliance of Kirchhoff's law, the difference between the sum of source currents S-Igx and opposite load currents S-IIx is compared 405 against a 5% threshold of the sum of the source currents: 0.05*S-Igx. If the difference is below the threshold, the load feeder Y having the maximum current value "max $I_{LY}$" is identified 406 and the grid topology is checked for the availability of downstream current measurements 407. If none are available, the trip unit corresponding to the identified feeder Y is tripped 408. If downstream current measurements are available, and the current measurement for one of the downstream feeders matches the "max $I_{LY}$", the trip unit corresponding to that downstream feeder is tripped 409. Either way, this should result in clearance 410 of the phase fault. Once cleared, the process returns to the beginning of the flow chart 401.

If the difference 405 between the sum of source currents S-Igx and opposite load currents S-IIx exceeds the threshold, the processing continues with individual busbar analysis 411. In this analysis, as set out above, each source feeder is respectively considered as a potential origin of the phase fault and accordingly different equations are drawn up on the assumption that one of the respective source feeders actually operates as a load feeder. For each individual busbar, the resulting set of equations is evaluated to identify the source feeder per busbar that possibly feeds the phase fault. The equations provide per potentially contributing source feeder a sum of source and load currents. The source feeder having the minimum summed value directs to fault location, and accordingly a trace of source feeders having minimum summed values can be tracked. If the identified source feeders direct outside the surveillance area 412, the trip unit corresponding to that source feeder is tripped 413. If the identified source feeder does not direct outside the surveillance area 412, but directs to opposite ends of an internal feeder 414, trip units corresponding to both ends of that internal feeder are tripped 415. If after tripping of the trip units the voltage at the busbar is not recovered 416, all trip units of the associated busbar are tripped 417. In the end, the phase fault should be cleared 418 and the processing starts again at the begin of the flow chart 401.

In the above description, whenever a trip unit, such as a circuit breaker, is tripped, time dependencies should be taken into account as is known in the art.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

The invention claimed is:

1. A computer implemented method for locating phase faults in a microgrid in off-grid mode comprising:
    defining a surveillance area of the microgrid having at least two busbars to monitor;
    assessing all source feeders and load feeders of the surveillance area;
    acquiring measurement data, the data comprising current magnitude for all source feeders and load feeders;
    monitoring the at least two busbars in the surveillance area for a voltage dip in one of phase-to-phase or phase-to-neutral voltages as indication of a phase fault; and
    on detecting the voltage dip:
        determining a defect phase having a minimum phase-to-neutral voltage from a plurality of phases; and
        for the determined defect phase, performing current analysis for the defect phase to locate a phase fault on the defect phase and protect the microgrid in the off-grid mode, wherein performing current analysis comprises:
applying Kirchhoff's current law to determine if a detected phase fault is located outside and/or downstream of the surveillance area; and
if Kirchhoff's law is not violated, tripping a main circuit breaker corresponding to a load feeder having a maximum current value, and
wherein performing current analysis further comprises:
if Kirchhoff's law is violated,
determining for each busbar in the surveillance area at least one minimum source feeder having a minimum summed current value of all source feeders of the respective busbar, and
determining a trace of the minimum source feeders across the surveillance area, and;
if the trace points to a fault location outside the surveillance area, tripping a circuit breaker corresponding to the source feeder at the end of the trace; and/or
if the trace points to a fault location at an internal feeder inside the surveillance area, tripping circuit breakers of the internal feeder at both ends of the trace.

2. The method according to claim 1, wherein Kirchhoff's law is not violated with a first error margin of 5% or less.

3. The method according to claim 1, wherein performing current analysis further comprises:
if Kirchhoff's law is not violated, and if current measurement data is available for a feeder on a level downstream, if one phase current of the feeder downstream equals, with a second error margin, the current of the load feeder is the maximum current, then:
prior to or instead of tripping the main circuit breaker corresponding to the load feeder having the maximum current value, tripping the corresponding downstream level load feeder with a time delay.

4. The method according to claim 3, wherein the second error margin is 10% or less.

5. The method according to claim 1, wherein performing current analysis further comprises:
if after a predetermined time delay from tripping one or more circuit breakers a voltage disturbance is still present, then tripping all circuit breakers of all feeders of the respective busbar.

6. A computer implemented method for locating phase faults in a microgrid in off-grid mode comprising:
defining a surveillance area of the microgrid having at least two busbars to monitor;
assessing all source feeders and load feeders of the surveillance area;
acquiring measurement data, the data comprising current magnitude for all source feeders and load feeders;
monitoring the at least two busbars in the surveillance area for a voltage dip in one of phase-to-phase or phase-to-neutral voltages as indication of a phase fault; and
on detecting the voltage dip:
determining a defect phase having a minimum phase-to-neutral voltage from a plurality of phases; and
for the determined defect phase, performing current analysis for the defect phase to locate a phase fault on the defect phase and protect the microgrid in the off-grid mode,
wherein performing current analysis further comprises:
assigning opposite signs to source currents and load currents;
summing all current magnitudes to locate a phase fault inside or outside the surveillance area;
if the summed currents are zero within a first margin, determining the load feeder outside the surveillance area having a maximum current value in one of the three phases; and
if no current measurement is available for a feeder downstream, tripping with a certain time delay a circuit breaker corresponding to the determined load feeder having the maximum current value; or
if downstream current measurements are available for feeders further downstream, and
if one downstream current measurement equals within a second margin the current of the determined load feeder having the maximum current value, tripping the corresponding downstream load feeder with a time delay; or
if none of the downstream current measurement equals within a 10% margin the current of the determined load feeder having the maximum current value, then tripping a circuit breaker corresponding to the determined load feeder having the maximum current value.

7. The method according to claim 6, wherein performing current analysis further comprises:
if the summed currents are non-zero within the first margin,
determining for each busbar in the surveillance area at least one minimum source feeder having a minimum summed current value of all source feeders of the respective busbar, and
tracking a trace of the minimum source feeders across the surveillance area;
if the trace points to a source feeder outside the surveillance area, tripping a circuit breaker corresponding to the source feeder at the end of the trace; if the trace points to a fault location at an internal source feeder inside the surveillance area, tripping circuit breakers of the internal source feeder at both ends of the trace.

8. The method according to claim 7, wherein performing current analysis further comprises:
if after a predetermined time delay following the tripping of one or more circuit breakers a voltage disturbance is still present, then tripping all circuit breakers of all feeders of the corresponding busbar.

9. A computer program product, comprising a computer program with instructions which, when executed on at least one processor, cause the at least one processor to carry out the method according to claim 1.

10. A computer readable medium having stored thereon computer executable code for execution by computer processors controlling the microgrid, wherein execution of the instructions of the executable code causes the computer processors to execute the computer-implemented method of claim 1 on the microgrid.

11. A microgrid central controller, comprising:
communication means for collecting measurement data from measurement devices and exchanging control data with control devices;
at least one computer processor for executing instructions; and
a computer program product, comprising a computer program with instructions which, when executed on the at least one processor, cause the at least one computer processor to carry out the method according to claim 1.

12. The method according to claim 1, wherein performing current analysis comprises:
- applying Kirchhoff's current law to determine if a detected phase fault is located outside and downstream of the surveillance area; and
- if Kirchhoff's law is not violated, tripping a main circuit breaker corresponding to a load feeder having a maximum current value.

13. The method according to claim 6, wherein the certain time delay is a predetermined time delay based on time discrimination rules between circuit breakers.

* * * * *